US009853443B2

(12) United States Patent
Nicolescu et al.

(10) Patent No.: US 9,853,443 B2
(45) Date of Patent: Dec. 26, 2017

(54) ARC FAULT DETECTION AND EXTINGUISHING

(71) Applicant: Solantro Semiconductor Corp., Ottawa (CA)

(72) Inventors: Alexandru Dorin Nicolescu, Toronto (CA); Raymond Kenneth Orr, Kanata (CA)

(73) Assignee: Solantro Semiconductor Corp., Ottawa (CA)

( * ) Notice: Subject to any disclaimer, the term of this patent is extended or adjusted under 35 U.S.C. 154(b) by 72 days.

(21) Appl. No.: 14/316,477

(22) Filed: Jun. 26, 2014

(65) Prior Publication Data

US 2015/0381111 A1  Dec. 31, 2015

(51) Int. Cl.
| H02S 50/10 | (2014.01) |
| H02H 1/00 | (2006.01) |
| H02H 3/46 | (2006.01) |
| H02H 7/20 | (2006.01) |
| H02S 40/32 | (2014.01) |
| H02S 40/34 | (2014.01) |
| H01L 31/02 | (2006.01) |

(52) U.S. Cl.
CPC ......... *H02H 3/46* (2013.01); *H01L 31/02021* (2013.01); *H02H 1/0015* (2013.01); *H02H 7/20* (2013.01); *Y02E 10/56* (2013.01)

(58) Field of Classification Search
CPC .......... H02H 1/0015; H02H 3/46; H02H 7/20; H02S 40/32; H02S 40/34; H02S 50/10; H01L 31/02021; H01L 31/042
USPC .......................................................... 361/42
See application file for complete search history.

(56) References Cited

U.S. PATENT DOCUMENTS

| 8,218,274 B2 | 7/2012 | Hastings et al. |
| 2011/0019444 A1 | 1/2011 | Dargatz et al. |
| 2012/0112760 A1* | 5/2012 | Yoscovich ........ H01L 31/02021 324/536 |
| 2012/0318320 A1 | 12/2012 | Robbins |

(Continued)

FOREIGN PATENT DOCUMENTS

| AU | 2010101074 A4 * | 11/2010 | ........... H02H 1/0015 |
| CN | 102854426 A * | 1/2013 | |
| KR | 20130081697 A | 7/2013 | |

OTHER PUBLICATIONS

Machine translation of Junsong Chinese Patent Document CN 102854426 A, Jan. 2, 2013.*

(Continued)

*Primary Examiner* — Scott Bauer
*Assistant Examiner* — Kevin J Comber
(74) *Attorney, Agent, or Firm* — Barnes & Thornburg LLP

(57) ABSTRACT

A first switch for connection in a first circuit path between a PV panel string and an inverter in a power system, and a second switch for connection in a second circuit path across an output of the PV panel string, are normally closed and open, respectively, during non-fault operation of the power system. Both series and parallel arc faults in the power system can be extinguished by further control of the switches. Arc fault detection could be based on probabilistic frequency analysis of current or power flow measurements in the PV panel string, current or power imbalance, interruption in communications with the PV panels, or combinations of these techniques.

7 Claims, 12 Drawing Sheets

(56) References Cited

U.S. PATENT DOCUMENTS

2013/0015875 A1     1/2013   Kumar
2013/0335861 A1    12/2013   Laschinski et al.
2014/0373894 A1*   12/2014   Stratakos ............... H02S 50/00
                                                                                                           136/244

OTHER PUBLICATIONS

Marcelo C. Gonzalez et al., "Detection of High-Impedance Arcing Faults in Radial Distribution DC Systems", Amercian Institute of Aeronautics and Astronautics, 1st International Energy Conversion Engineering Conference (IECEC), Aug. 17-21, 2003, Portsmouth, Virginia.
Jay Johnson et al., "Crosstalk Nuisance Trip Testing of Photovoltaic DC Arc-Fault Detectors", 38th Photovoltaics Specialists Conference, IEEE, 2013.
Jay Johnson et al., "Differentiating Series and Parallel Photovoltaic Arc-Faults", 38th Photovoltaic Specialists Conference, Jun. 4, 2012, Austin, TX.
Extended European Search Report dated Oct. 26, 2015 in respect of European Patent Application No. 15173826.8 (5 pages).

* cited by examiner

ARC FAULT DETECTION AND EXTINGUISHING

TECHNICAL FIELD

Embodiments herein generally relate to arc fault detection and extinguishing, and specifically to Direct Current (DC) arc fault detection and extinguishing in solar PhotoVoltaic (PV) systems.

BACKGROUND

Arc faults in DC PV systems can be problematic. Sustained arc faults result in power losses, and can lead to overheating, fire, and possibly other effects such as energizing components or structures such as mounting systems that are not normally energized.

While there are techniques for detecting different types of arc faults, some of these techniques are complex and/or suited for detection of only certain types of arc faults. Arc fault extinguishing techniques can also be specific to arc fault type.

SUMMARY

According to an embodiment, an arc fault extinguisher includes a first switch for connection in a first circuit path between a PV panel string and an inverter in a power system, a second switch for connection in a second circuit path across an output of the PV panel string, and a controller, coupled to the first switch and the second switch. The controller is configured to control the first switch to be closed and the second switch to be open during non-fault operation of the power system, to control the first switch to open on detection of an arc fault in the power system, and to control the second switch to close on detection of an arc fault in the power system.

The controller could be configured to control the first switch to open on detection of an arc fault in the power system and to close the second switch while the first switch is open on detection of an arc fault in the power system.

The controller could be configured to instead control the second switch to close on detection of an arc fault in the power system and to open the first and second switches on detection of a continued arc fault in the power system.

The controller could be configured to detect arc faults by frequency analysis, which could involve obtaining measurement samples of current or power flow in the PV panel string, computing frequency components of the measurement samples in a frequency spectrum, and detecting an arc fault in the power system where at least a predetermined number of the frequency components, including any of the frequency components in the frequency spectrum, exceed a threshold amplitude.

In some embodiments, the controller is configured to detect arc faults by a combination of frequency analysis and measurements at PV panels in the PV panel string.

The controller could also or instead be configured to detect arc faults based on measurements at more than one PV panel in the PV panel string.

Another option for arc fault detection involves the controller being configured to detect arc faults on determining that a current or power imbalance based on measurements of current or power flow at each of multiple PV panels in the PV panel string exceeds a threshold.

An arc fault extinguisher could also include a transceiver, coupled to the controller, to enable communications between the controller and PV panels in the PV panel string. The controller could then be configured to detect arc faults based on interruption in communications with a subset of the PV panels. In embodiments where the controller is configured to poll interface devices at the PV panels to report their presence, the controller could be configured to detect arc faults based on interruption in communications with a subset of the PV panels occurring within a predetermined time period.

A method is also disclosed, and involves controlling first and second switches. The first switch, in a first circuit path between a PV panel string and an inverter in a power system, is controlled to be closed during non-fault operation of the power system. The second switch, in a second circuit path between output terminals of the PV panel string, is controlled to be open during non-fault operation of the power system. The method also involves controlling the first switch to open on detection of an arc fault in the power system, and controlling the second switch to close on detection of an arc fault in the power system.

In an embodiment, controlling the first switch to open involves controlling the first switch to open on detection of an arc fault in the power system, and controlling the second switch to close involves controlling the second switch to close while the first switch is open on detection of an arc fault in the power system.

The method could involve controlling the second switch to open on detection of a continued arc fault in the power system after the second switch is closed, in which case controlling the first switch to open could involve controlling the first switch to open on detection of a continued arc fault in the power system after the second switch is closed.

Another method involves obtaining measurement samples of current or power flow in a power system which includes PV panels, computing frequency components of the measurement samples in a frequency spectrum, and detecting an arc fault in the power system where at least a predetermined number of the frequency components, including any of the frequency components in the frequency spectrum, exceed a threshold amplitude.

The obtaining could involve measuring the current or power flow in the power system.

In some embodiments, the obtaining involves obtaining measurement samples of current or power flow in each of multiple strings of PV panels in the power system.

According to another embodiment, a method involves obtaining measurements of current or power flow at each of multiple PV panels connected together in one or more respective circuit paths in a power system, determining whether a current or power imbalance based on the measurements exceeds a threshold, and detecting an arc fault in the power system where it is determined that the current or power imbalance exceeds the threshold.

The determining could involve determining whether a difference in the measurements of the current at different ones of the PV panels in each circuit path exceeds the threshold.

The method could also involve obtaining a measurement of total output power from the PV panels, in which case the determining could involve determining whether an amount, by which a total of the measurements of power flow at each of the PV panels exceeds the measurement of total output power, exceeds the threshold.

The obtaining could involve receiving measurements of the current or power flow from the PV panels through communications with the PV panels. The method might then involve detecting an arc fault in the power system based on interruption of communications with the PV panels.

Another embodiment of a method involves monitoring communications with PV panels in a power system, and detecting an arc fault in the power system based on an interruption in communications with any of a predetermined number of the PV panels.

The monitoring could involve polling interface devices at the PV panels in each polling operation to report their presence, in which case the detecting could involve detecting an arc fault based on interruption in communications with any of a predetermined number of the PV panels within a predetermined time period.

Other aspects and features of embodiments of the present disclosure will become apparent to those ordinarily skilled in the art upon review of the following description.

BRIEF DESCRIPTION OF THE DRAWINGS

Embodiments herein will be better understood from the following detailed description with reference to the drawings, in which.

DETAILED DESCRIPTION

Photovoltaic (PV) panels are becoming an important source of power generation. PV panels are routinely serially connected together to form panel "strings". PV panels produce DC power and the combined voltage of a PV panel string can easily reach hundreds of volts. At these voltages, self-sustaining electrical arc faults can occur, which could result in serious damage to a PV array, fire or injury to personnel.

An arc fault is large and undesired flow of electrical current between two conductors. The current flow can create significant amounts of heat and cause significant damage. An arc fault current typically travels between the two conductors via an ionized gas plasma, which in the case of DC voltages can be self-sustaining. Arc faults could lead to electrification of a PV panel mounting system, serious damage to equipment, fire, and/or injuries to personnel.

Detection of electrical arc faults is becoming an important safety consideration. For example, article 690.11 of the 2011 National Electrical Code (NEC) requires PV systems, with DC source circuits, DC output circuits, or both, on or penetrating a building and operating at a PV system maximum system voltage of 80 volts or greater, to detect and interrupt series arc faults in modules, connections, wiring, and other components.

Arc faults in a PV array or string have a variety of causes including: failure of insulation of string wiring, corrosion of string connectors, or accidental severing of the string wiring, for example.

Figure 1A:
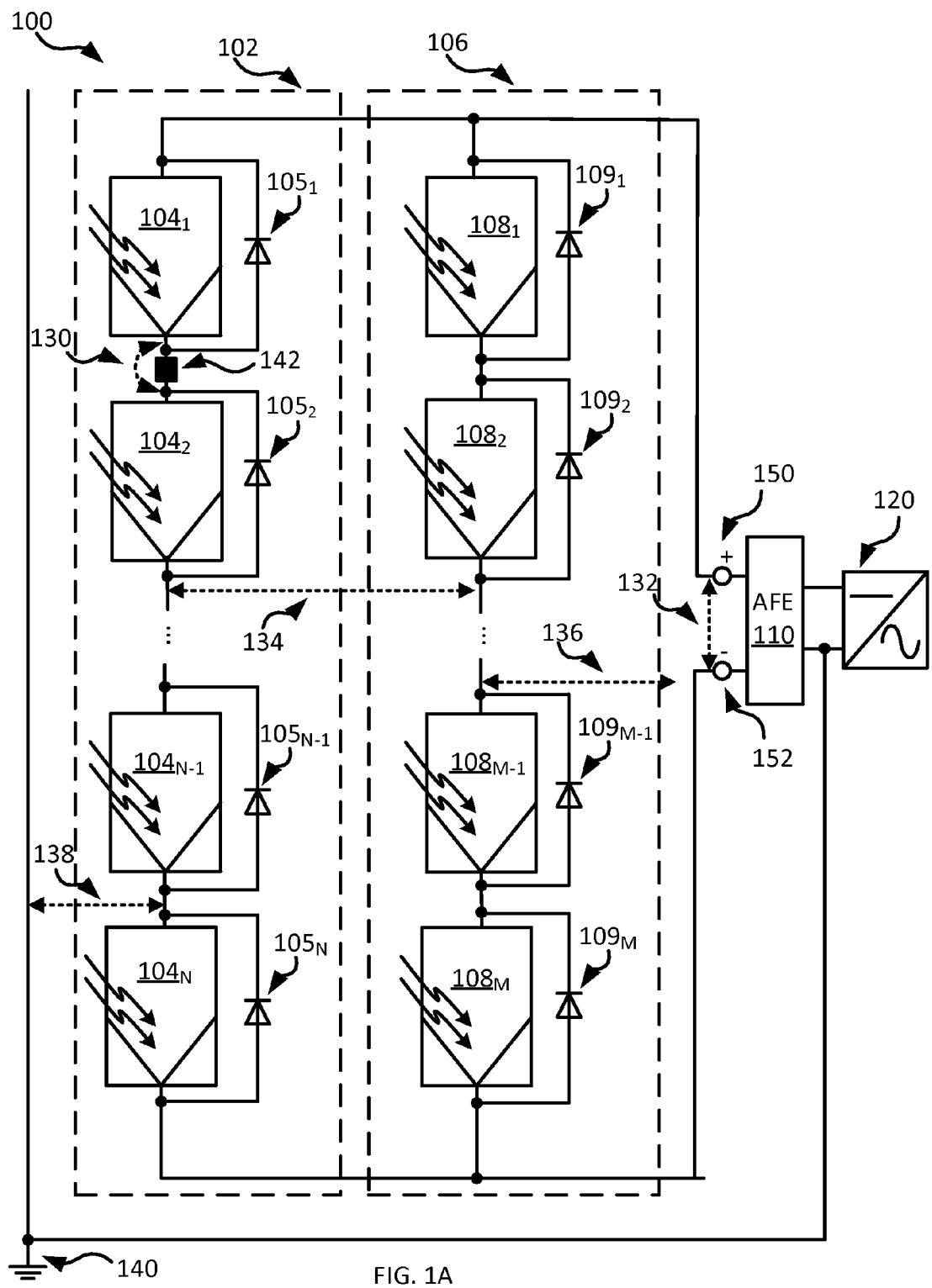
FIG. 1A is a block diagram of an example PV power system.

FIG. 1A is a block diagram of an example PV power system 100, which is equipped with an arc fault extinguishing system. PV power system 100 comprises PV strings 102 and 106, inverter 120, Arc Fault Extinguisher (AFE) 110 and equipment ground 140. PV string 102 comprises a series of PV panels $104_1, 104_2 \ldots 104_{N-1}, 104_N$ connected in a circuit path, and bypass diodes $105_1, 105_2 \ldots 105_{N-1}, 105_N$. PV string 106 comprises a series of PV panels $108_1, 108_2 \ldots 108_{M-1}, 108_M$ connected in another circuit path, and bypass diodes $109_1, 109_2 \ldots 109_{M-1}, 109_M$. There are typically 10 to 20 PV panels in a string. The DC output voltage of a single PV panel is typically 40 to 60 volts, depending on the number of PV cells in the PV panel and the PV cell technology. DC string voltages thus can be hundreds of volts. DC string currents depend on the amount of insolation and the area of the PV panels but can easily be eight amperes.

Bypass diodes $105_1, 105_2 \ldots 105_{N-1}, 105_N$ and $109_1, 109_2 \ldots 109_{M-1}, 109_M$ are connected across, also referred to as in parallel with, PV panels $104_1, 104_2 \ldots 104_{N-1}, 104_N$ and $108_1, 108_2 \ldots 108_{M-1}, 108_M$, respectively. Bypass diodes are a commonly used PV panel protection device. Bypass diodes $105_1, 105_2 \ldots 105_{N-1}, 105_N$ and $109_1, 109_2 \ldots 109_{M-1}, 109_M$ are normally reverse biased and non-conducting when PV panels $104_1, 104_2 \ldots 104_{N-1}, 104_N$ and $108_1, 108_2 \ldots 108_{M-1}, 108_M$ are active and producing power. Bypass diodes can become forward biased and conduct if there is a significant current output imbalance between PV panels in the same string from, for example, shading of a PV panel. In this situation the shaded PV panel could produce significantly less current than the other PV panels in the string and potentially develop a large reverse voltage from the string current being forced through it. In this situation the bypass diode would become forward biased, conduct the string current, and prevent development of a large reverse voltage. PV panels could have more than one bypass diode. For example, a PV panel could have three bypass diodes, with each bypass diode connected across, or in parallel with, a third of the PV panel's solar cells.

PV strings 102 and 106 are operatively connected across, or in parallel with, the input of AFE 110. In FIG. 1A, the input of AFE 110 is represented as input terminals 150, 152, although discrete physical terminals need not necessarily be provided. The output of AFE 110 is operatively connected to the input of inverter 120. Inverter 120 converts the DC string voltage of the PV panels into an AC voltage suitable for an electrical grid or other distribution/load system at the inverter output.

It should be appreciated that FIG. 1A, and other drawings, are intended solely for illustrative purposes. Other embodiments could include further, fewer, or different elements which are coupled or operate together in a similar or different manner than shown. In FIG. 1A, for example, inverter 120 is shown as a two terminal, single phase inverter. However, it could instead be a three phase inverter.

Although the example power system 100 is shown with two PV strings 102 and 106, in other embodiments a single string or multiple strings are possible. Additional hardware items such as disconnect switches, fuses and/or string combiners could be provided have not been shown in FIG. 1A for simplicity of illustration.

Figure 1B:
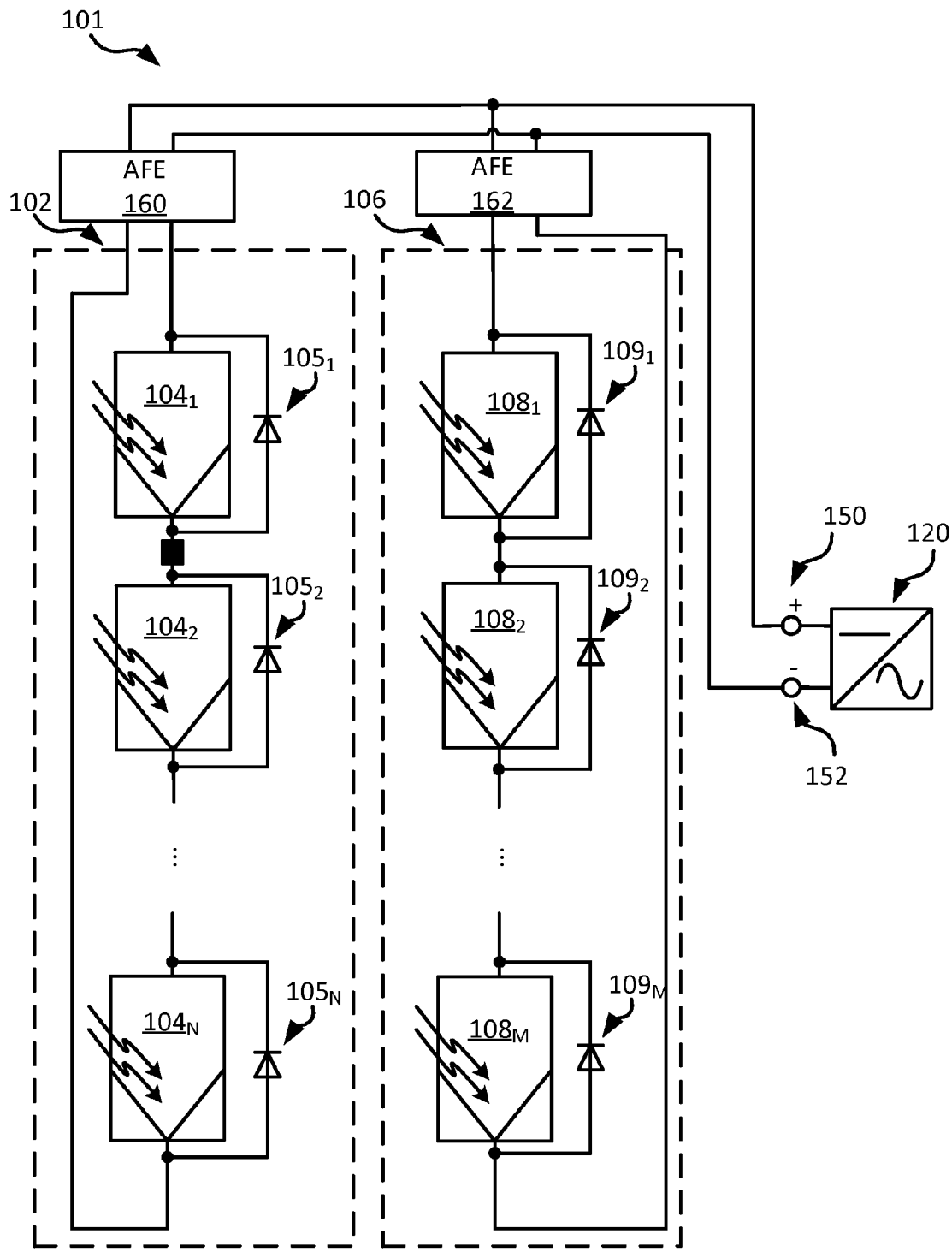
FIG. 1B is a block diagram of another example PV power system.

Other PV power system AFE configurations are possible. FIG. 1B is a block diagram of another example PV power system, with multiple AFEs. The example PV power system 101 comprises PV strings 102 and 106 and inverter 120 as in FIG. 1A, but also includes multiple Arc Fault Extinguishers (AFE) 160, 162. PV string 102 comprises a series of PV panels $104_1$, $104_2$ ... $104_N$ and bypass diodes $105_1$, $105_2$ ... $105_N$. PV string 106 comprises a series of PV panels $108_1$, $108_2$ ... $108_M$ and bypass diodes $109_1$, $109_2$ ... $109_M$. The inputs of AFEs 160, 162 are operatively connected to PV strings 102, 106. The outputs of AFEs 160, 162 are operatively connected to inverter 120.

The example AFE configurations as shown in FIGS. 1A and 1B could be used in new PV power systems as they are constructed, but they could also be used as retrofit solutions. The addition of an AFE such as 110 (FIG. 1A) to an existing PV power system with a central inverter 120 would entail connecting the AFE between the PV panel strings output and the inverter. Even the example AFE configuration shown in FIG. 1B could involve just adding an AFE 160, 162 at each PV string output.

AFE

Figure 2:
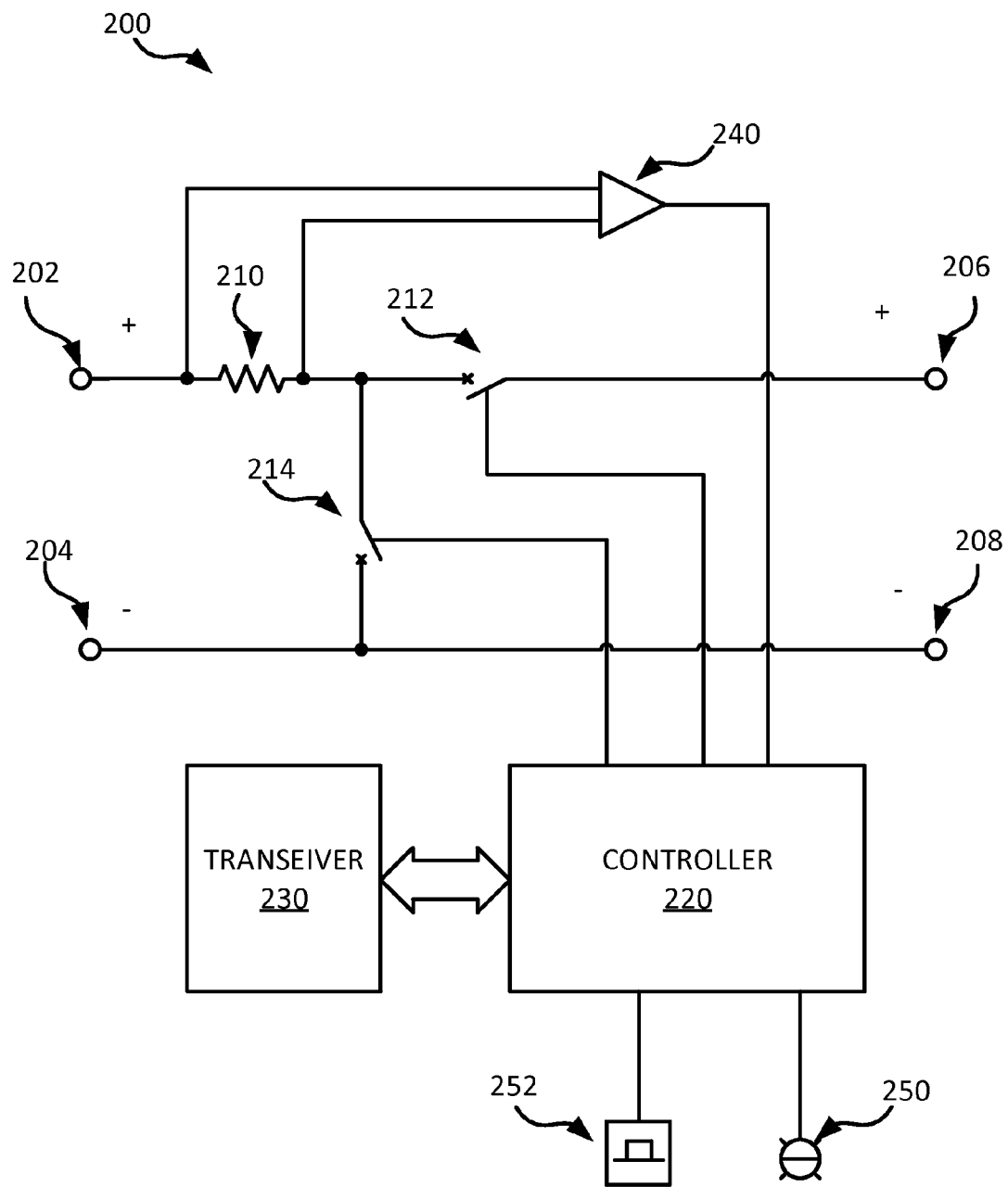
FIG. 2 is a block diagram of an example apparatus according to an embodiment.

FIG. 2 is a block diagram of an example apparatus according to an embodiment, specifically an example AFE which could be implemented as the AFEs 110, 160, 162 in FIGS. 1A and 1B. The example AFE 200 comprises input terminal pair 202, 204, output terminal pair 206, 208, sense resistor 210, a first (series) switch 212, a second (shunt) switch 214, controller 220, transceiver 230, analog front end processor 240, annunciator 250 and reset switch 252.

Terminal pairs 202, 204 and 206, 208 need not necessarily be discrete physical terminals, and could simply be connections. Analog front end processor 240 is shown as an amplifier in this example, but could take other forms.

The controller 220 and transceiver 230 could be implemented, for example, in hardware, firmware, one or more components which execute software, or combinations thereof. Examples of components that could be used to implement the controller 220 and/or the transceiver 230 include microprocessors and other types of processing devices, microcontrollers, Application Specific Integrated Circuits (ASICs), Field Programmable Gate Arrays (FPGAs), and other types of "intelligent" integrated circuits or devices. The exact form of the transceiver 230, for example, would depend on the type(s) of communications to be supported, but the transceiver 230 would generally include some type of physical interface with one or more components to perform receive and transmit operations.

The switches 212 and 214 could be solid state switches such as transistors, illustratively power Metal Oxide Semiconductor Field Effect Transistors (MOSFETs), or other types of switches such as mechanical relays. Reset switch 252 could similarly take various forms, although some sort of manual actuator for operation by a user would be provided in embodiments where manual reset is supported. Annunciator 250 could be implemented using any of various devices to provide one or more types of arc fault detection alert.

Input terminal pair 202, 204 is for coupling AFE 200 to the PV string(s) to receive the string current(s) and voltage. Output terminal pair 206, 208 is for coupling AFE 200 to the input of an inverter such as 120 in FIGS. 1A, 1B. A voltage is developed across sense resistor 210 when string current flows through it, and this voltage is sensed by analog front end processor 240. Analog front end processor 240 amplifies the sense voltage and passes it to controller 220 in the example shown. Analog front end processor 240 could perform additional functions such as any one or more of filtering, isolation, level shifting and digitization of the sense voltage. Alternately, any one or more of these functions might be performed by controller 220.

In this embodiment, sense resistor 210 is located between terminal 202 and switch 214 on the "high side" of AFE 200. A sense resistor such as 210 could also or instead be located between terminal 204 and switch 214 on the "low side" of AFE 200. If terminal 204 is connected to a system ground, then this could make string current sensing easier since an isolated sensing scheme might not be used.

Transceiver 230 enables communications with controller 220 and allows AFE 200 to communicate with an inverter and/or panel interface device attached to each PV panel such as, for example, a DC optimizer. Transceiver 230 could support wired and/or wireless communications. Wired communication could be, for example, through Power Line Communications, Ethernet or twisted pair conductors. Wireless communications could involve, for example, Wi-Fi, ZIGBEE, and/or a proprietary protocol.

Switches 212 and 214, as noted above, could be solid state switches such as power MOSFETS for example, or electro-mechanical switches. Electro-mechanical switches could be useful when multiple strings are connected to the AFE 200 and PV string currents are large.

Controller 220 controls the opening and closing of switches 212 and 214. Controller 220 could be a microcontroller and could comprise a processor, signal processing circuitry, and non-volatile and/or volatile memory for the storage of such contents as firmware, system parameters, and/or measurements.

Annunciator 250 signals the detection of an arc fault, and could provide any of various types of arc fault detection alerts, such as visible alerts using one or more Light Emitting Diodes (LEDs) and/or audible alerts using a speaker. In other embodiments, arc fault detection alerts are also provided to other components through the transceiver 230. In general, a detected arc fault could be reported locally at the example AFE 200 by annunciator 250, and/or through the transceiver 230 to other components which could be remote components not co-located with the AFE.

Reset switch 252 could be used to reset AFE 200 once an arc fault has been corrected and it is safe for the PV power system to resume operation.

Arc Faults

Arc faults can be classified as series faults or parallel faults.

A series arc fault is an arc fault in a circuit path, between normally connected conductors in a PV string, and could occur, for example, as a result of a corroded connector or a severed power cable. If a connector becomes corroded, then it could become high resistance or make intermittent contact. In either case, a substantial portion of the PV string voltage could appear across the connector, which could create an arc. If a power cable is severed, then it could still make intermittent contact and the entire PV string voltage could at times appear across the discontinuity and an arc fault could be created at that point. Arc fault 130 across connector 142 in FIG. 1A is an example of a series arc fault.

A parallel fault is a fault between two conductors of different voltages, such as a power line and a return line, for example. Parallel faults can result from breakdown in insulation between conductors. Arc faults 132, 134, 136 and 138 in FIG. 1A are examples of parallel arc faults. Arc fault 132 occurs across the output of the PV panel strings 102 and 106. Arc fault 134 is an inter-string fault and occurs between PV strings 102 and 106. Arc fault 136 occurs between the PV string 106 and the power return. Arc fault 138 is a fault to ground and occurs between PV string 102 and equipment ground 140. More generally, a parallel arc fault is between conductors that are not normally directly connected to each other. Depending on the physical layout of PV panels in a PV string, segments of a PV string conductor could be close enough to each other for an arc fault to occur within a single PV string, between such segments.

The occurrence of arc faults can be difficult to distinguish from normal operation of a PV power system. For example, the current conducted by series arc fault 130 might be not significantly different from the normal string current of PV string 102. Although parallel arc faults 132, 134, 136 and 138 could result in a significant drop in the input current to inverter 120, it could be difficult to distinguish this from normal variation in string current due to, for example, the rapid movement of clouds. This could especially be the case where there are a large number of PV strings connected to a single inverter and the current decrease from an arc fault in a single PV string could be relatively insignificant compared to the normal variation in the combined string current of all the other PV strings.

ARC Fault Detection

Arc faults are known to produce high frequency electrical noise. This noise could be used to detect the presence of an arc fault. Some methods attempt to create a spectral signature for the electrical noise of an arc fault and then detect the presence of an arc fault by comparing measured spectra to the arc fault signature. The spectral signature is a specific combination of electrical frequencies and their amplitudes which distinguish an arc fault from normal operation. For example, one known method describes monitoring a frequency of around 19 MHz to detect an arc. See Marcelo C. Gonzalez et al., "DETECTION OF HIGH-IMPEDANCE ARCING FAULTS IN RADIAL DISTRIBUTION DC SYSTEMS", American Institute of Aeronautics and Astronautics, 1st International Energy Conversion Engineering Conference (IECEC), 17-21 Aug. 2003, Portsmouth Va.

In another method the amplitude of multiple frequencies is measured using a current transformer and an arc fault is reported when the amplitude of all the frequencies reach above their corresponding threshold amplitudes for a predetermined time. See Jay Johnson et al., "Crosstalk Nuisance Trip Testing of Photovoltaic DC Arc-Fault Detectors, 38th Photovoltaics Specialists Conference, IEEE, 2013, and U.S. Pat. No. 8,218,274. A difficulty of these deterministic methods is the wide variety of possible arc faults and their associated spectral signatures which could lead to undetected arc faults (false negatives). Thus, while a particular combination of frequencies and associated amplitude thresholds could detect a particular arc fault type, another type of arc fault could be characterized by a different frequency and amplitude combination which could escape detection. For example, series arc faults can occur inside a PV panel, inside a PV panel junction box, at a power cable connection to a junction box or within a power cable. Each of these faults could have quite different signatures owing to the different conductor and insulator materials and the different geometries involved.

Rather than detecting an arc fault by matching all measured, specific spectra to a specific spectral signature, it could be possible to detect an arc fault using a probabilistic method in which only the number of spectral components with an amplitude greater than a common amplitude threshold ($A_T$) is important. In this method, it is unimportant which specific components have an amplitude greater than $A_T$. This probabilistic method could be robust in detecting a wide variety of arc faults with a variety of arc fault signatures. As long as the total number of frequency components which have an amplitude greater than the common amplitude threshold is greater than or equal to a minimum arc threshold count ($N_{DET}$), then an arc fault will be detected. Any of a wide variety of arc fault signatures could be detected by choosing a frequency range wide enough to encompass the important spectral components of all of their signatures.

Such a probabilistic "binning" method is based on a count of frequency components above a threshold. The exact location of the components in the frequency range is unimportant and an arc fault could be detected based only on the total number of components of its signature exceeding a threshold value.

Figure 3:
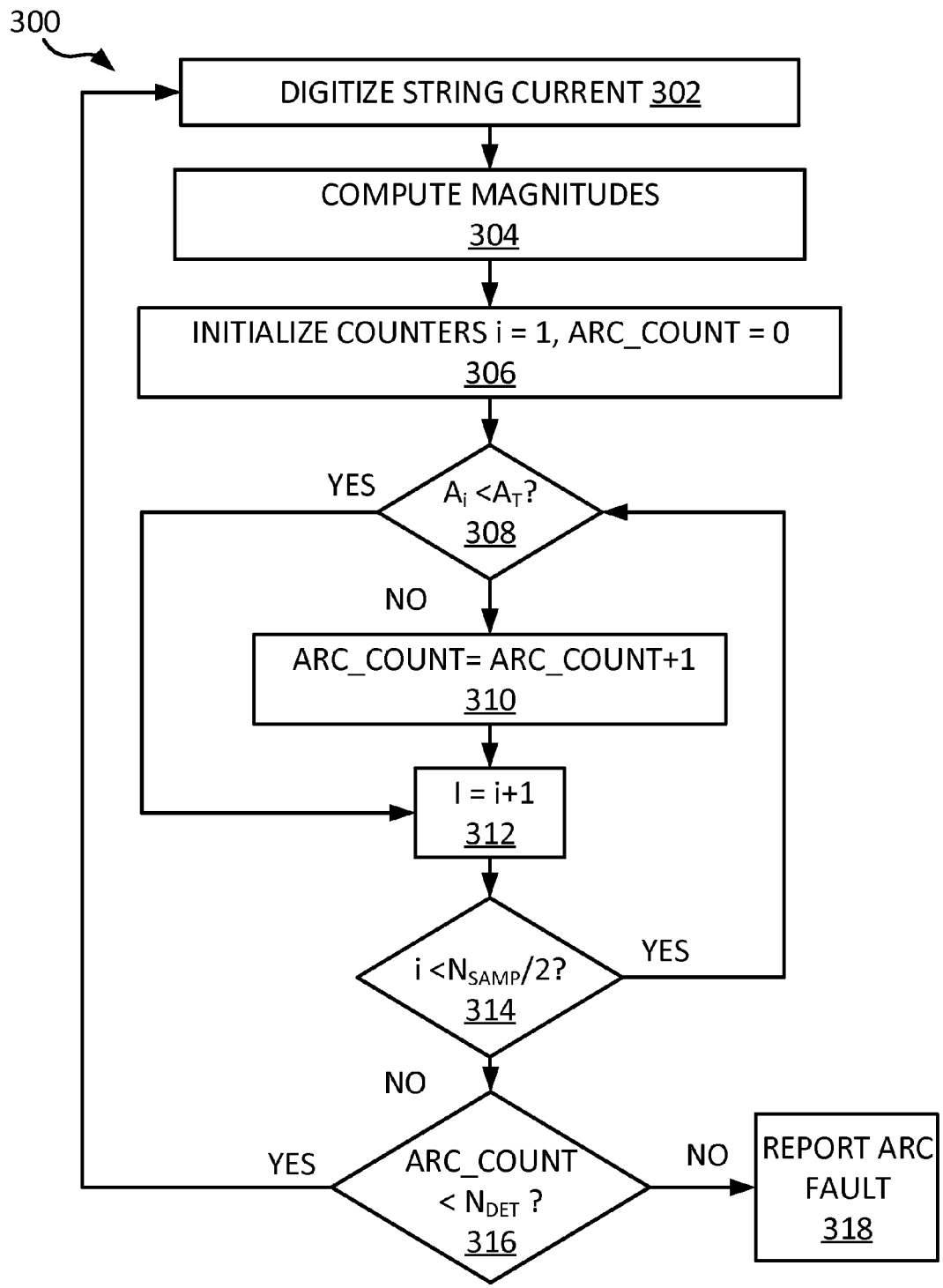
FIG. 3 is a flow diagram of an example arc fault detection method.

FIG. 3 is a flow diagram of an example arc fault detection method. At 302 in the example method 300, PV string current is measured. In one embodiment, the PV string current is measured using a sense resistor such as sense resistor 210 of AFE 200 (FIG. 2). The PV string current passes through the sense resistor and generates a voltage. The voltage could be filtered, amplified, and digitized by means such as front end processor 240 of AFE 200 (FIG. 2). "$N_{SAMP}$" voltage measurements are made with a sampling frequency $f_{SAMP}$ where $N_{SAMP}$ is an even integer.

At 304, the frequency spectrum of the PV string current is computed. In one embodiment, this is done using a Discrete Fast Fourier Transform (DFFT). The frequency spectrum is calculated over a frequency range from zero to $f_{SAMP}/2$. The frequency spectrum will have $N_{SAMP}/2$ discrete components at frequencies of $$f_i = \frac{i * f_{SAMP}}{N_{SAMP}}$$

where $1 \leq i \leq N_{SAMP}/2$ and the amplitude of the i-th frequency component is defined as $A_i$. It could be beneficial to filter the sense voltage prior to digitization to remove frequencies greater than $f_{SAMP}/2$ to prevent aliasing. In one embodiment, $f_{SAMP}=250$ kHz and $N_{SAMP}=128$ for a power system comprising a single string of eight PV panels, although other values are possible in other embodiments.

At 306, a frequency component counter "i" is initialized to one and an arc counter (ARC_COUNT) is initialized to zero. The arc counter counts the number of frequency components which have an amplitude $A_i$ greater than an amplitude threshold ($A_T$).

At 308, the amplitude $A_i$ of the i-th component is compared to amplitude threshold $A_T$. If the component amplitude is less than the threshold (YES at 308) then component counter "i" is incremented at 312. If the component amplitude is not less than the threshold (NO at 308) then the arc counter ARC_COUNT is incremented at 310 and the component counter incremented at 312. In one embodiment, $A_T$ is 13 dB above the system noise floor, although other thresholds are also possible.

At 314, the component counter is compared to the number of components ($N_{SAMP}/2$). If the component counter is less than $N_{SAMP}/2$ (YES at 314), the amplitude of the next component is compared to $A_T$ at 308. If the component counter is not less than $N_{SAMP}/2$ (NO at 314) then the arc counter is compared to a minimum arc threshold count ($N_{DET}$) at 316. The minimum arc threshold count is a positive integer value and represents the minimum number of components with amplitude equal to or above amplitude threshold $A_T$ to declare an arc fault. If the arc count is below $N_{DET}$ (YES at 316) then a new series of measurements are made at 302. If the arc count is not below $N_{DET}$ then an arc is reported at 318. In one embodiment $N_{DET}$ is 20 when the number of components is 64, although other values of $N_{DET}$ are possible. $N_{DET}$, and other parameters such as $A_T$, $f_{SAMP}$, and/or $N_{SAMP}$, could have different values in different embodiments, dependent upon the frequency spectrum ranges that are relevant to the arc fault types to be detected.

In another embodiment, the determinations at 316 and 314 could be reversed. The minimum number of frequency components having $A_i \geq A_T$ could be detected before all N/2 frequency components have been considered, and in that case a fault could be reported at 318 before the component count is checked at 314. In this case, on a YES determination at 318, the component counter is checked at 314, and a NO determination from 314 returns processing to 302.

In a series arc fault, the arc fault current will flow through an AFE and could be sensed. In a parallel arc fault, the arc fault current might not directly flow through the AFE, but the AFE could still sense the arc fault. Referring to FIG. 1A, the current in arc fault 136 flows through PV panels $108_M$ and $108_{M-1}$ and not through AFE 110. Parallel arc fault 136 could still be detected by AFE 110, since the output voltage of the series combination of PV panels $108_M$ and $108_{M-1}$ will be decreased and modulated by arc fault 136, resulting in a modulation of the string current flowing into AFE 110 from PV panels $108_1$ to $108_{M-2}$ at the arc fault frequencies.

PID Panel Array

Figure 4A:
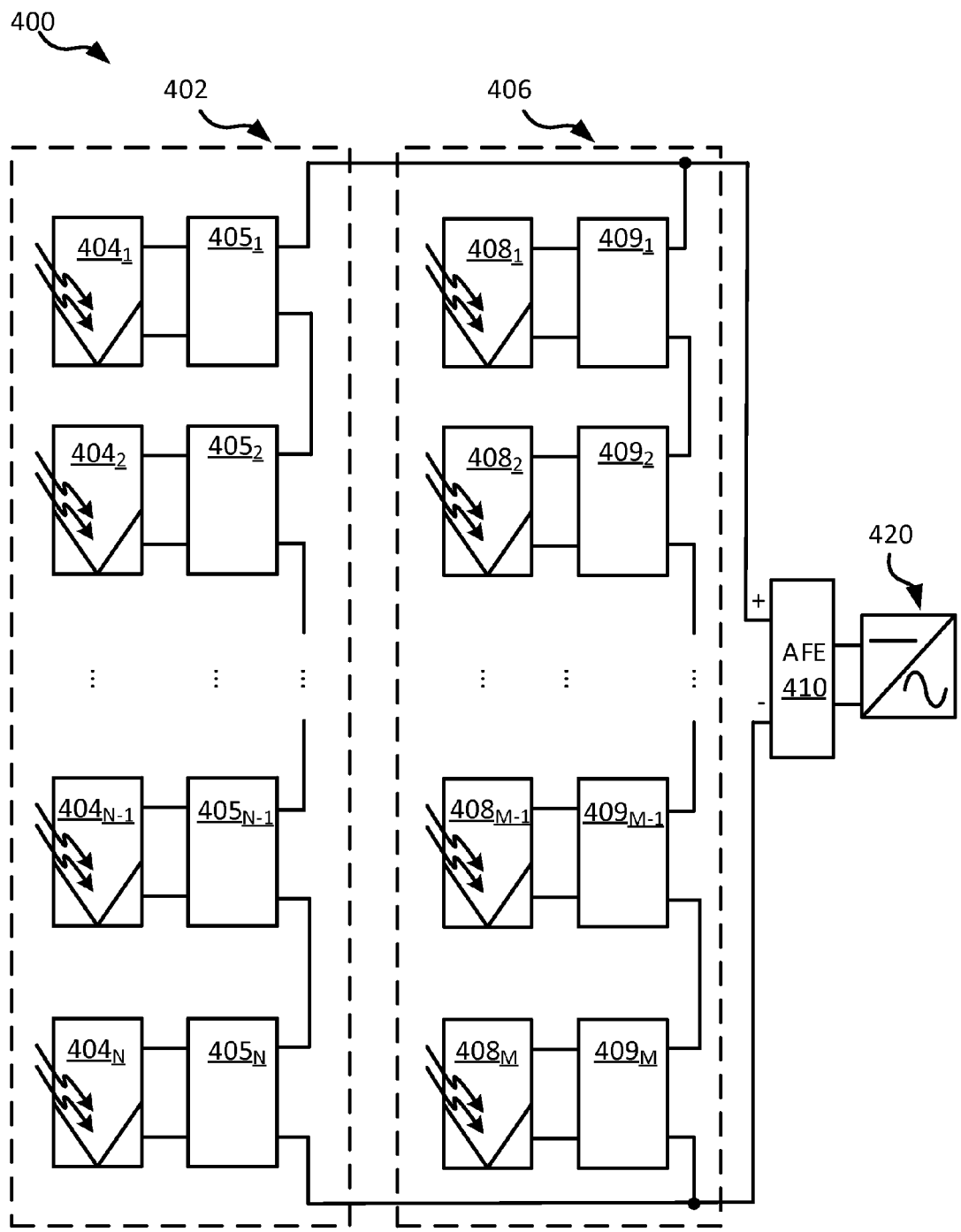
FIG. 4A is a block diagram of another example PV power system.

FIG. 4A is a block diagram of another PV power system equipped with arc fault detection. Example PV power system 400 comprises PV panel strings 402 and 406, AFE 410 and inverter 420. PV panel string 402 comprises PV panels $404_1$, $404_2$ ... $404_{N-1}$, $404_N$ and Panel Interface Devices (PIDs) $405_1$, $405_2$ ... $405_{N-1}$, $405_N$. PV panel string 406 comprises PV panels $408_1$, $408_2$ ... $408_{M-1}$, $408_M$ and Panel Interface Devices (PIDs) $409_1$, $409_2$ ... $409_{M-1}$, $409_M$. The outputs of PV panels $404_1$, $404_2$ ... $404_{N-1}$, $404_N$ are coupled to the inputs of PIDs $405_1$, $405_2$ ... $405_{N-1}$, $405_N$ and the outputs of PV panels $408_1$, $408_2$ ... $408_{M-1}$, $408_M$ connect to the inputs of PIDs $409_1$, $409_2$ ... $409_{M-1}$, $409_M$. The outputs of PIDs $405_1$, $405_2$ ... $405_{N-1}$, $405_N$ are serially connected in a PV string circuit path of the PV string 402, and the outputs of PIDs $409_1$, $409_2$ ... $409_{M-1}$, $409_M$ are serially connected in a PV string circuit path of the PV string 406. FIG. 4A is an example only and in other embodiments there could be fewer or greater numbers of PV panel strings with an equal number or unequal numbers of PV panels and PIDs.

PIDs $405_1$, $405_2$ ... $405_{N-1}$, $405_N$ and $409_1$, $409_2$ ... $409_{M-1}$, $409_M$ could perform a variety of functions including Maximum Power Point (MPP) tracking, DC power optimization, bypass functionality, and/or safety disconnect functionality for their respective PV panels. Examples of devices that could be suitable for implementation as PIDs are disclosed, for example, in U.S. patent application Ser. No. 13/840,627 filed on Mar. 15, 2013 and entitled "PHOTOVOLTAIC BYPASS SWITCHING", and Ser. No. 13/840,162 filed on Mar. 15, 2013 and entitled "INTELLIGENT SAFETY DISCONNECT SWITCHING", the entire contents of each of which are incorporated herein by reference.

Figure 4B:
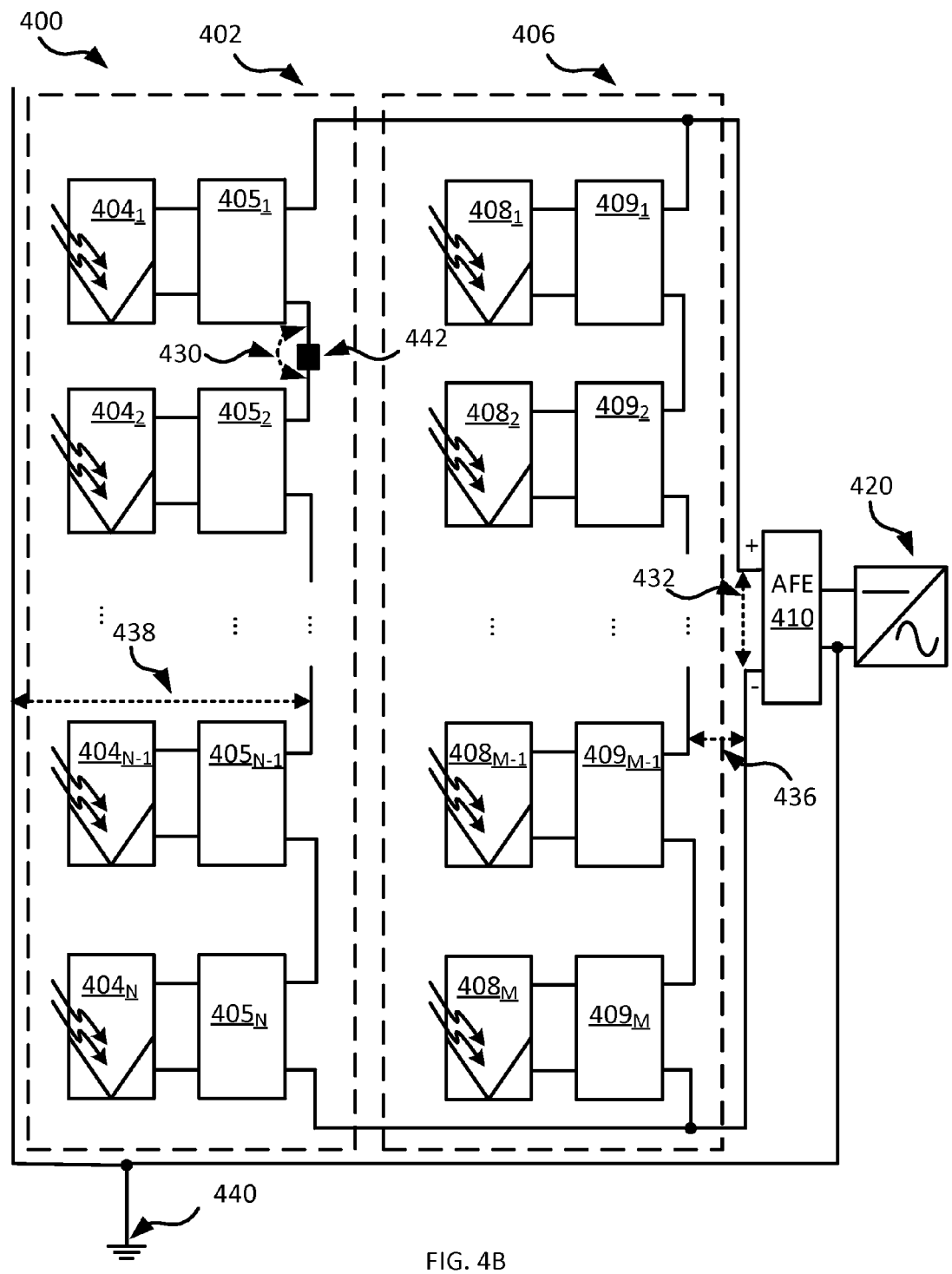
FIG. 4B is a block diagram showing possible arc faults in the example PV power system of FIG. 4A.

FIG. 4B is a block diagram showing possible arc faults in the example PV power system of FIG. 4A. Parallel arc fault 436 shorts the serial connection of PIDs $409_{M-1}$ and $409_M$ together and also connects PIDs $409_1$ ... $409_{M-2}$ across the input of AFE 410. Thus PIDs $409_{M-1}$ and $409_M$ experience a different load than PIDs $409_1$ ... $409_{M-2}$ which could result in a string current imbalance in which there is one value of output current in PIDs $409_1$ ... $409_{M-2}$ and a differing value of output current in PIDs $409_{M-1}$ and $409_M$.

Similarly, parallel arc fault 438 to ground shorts the circuit path of PIDs $405_{N-1}$ and $405_N$ to ground and connects PIDs $405_1$ ... $405_{N-2}$ across the input of AFE 410, again resulting differing loads. The differing loads could result in a string current imbalance in which there is one value of output current in PIDS $405_1$ ... $405_{N-2}$ and a differing value of output current in PIDS $405_{N-1}$, $405_N$.

Parallel arc fault 432 might not result in a PV string current imbalance since in this case all PIDs in PV strings 402 and 406 remain serially connected in their respective PV string circuit paths and could have the same output currents. PIDs in PV strings 402 and 406 could also remain balanced in the case of a series arc fault, such as for example, arc fault 430 across connector 442.

Figure 5:
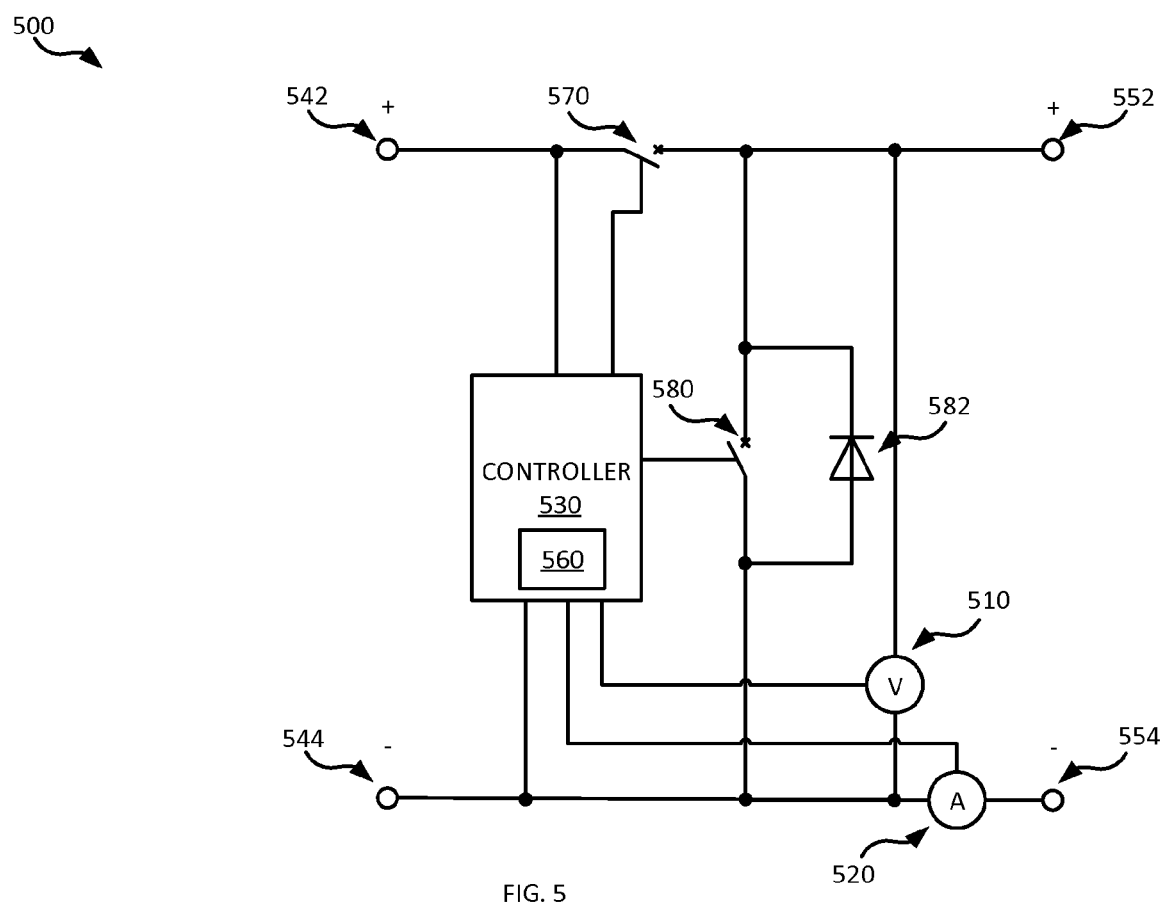
FIG. 5 is a flow diagram of an example Panel Interface Device (PID)

FIG. 5 is a schematic drawing of an example Panel Interface Device, which could be implemented as the PIDs in FIGS. 4A and 4B. Example PID 500 comprises voltage sensor 510 such as a voltmeter, current sensor 520 such as an ammeter, controller 530 with a communication module or means 560, input terminal pair 542, 544, output terminal pair 552, 554, switches 570 and 580, and diode 582. Controller 530 controls the operation of switches 570 and 580 and receives voltage and current measurements from voltage sensor 510 and current sensor 520, respectively.

Terminal pairs 542, 544 and 552, 554 need not necessarily be discrete physical terminals, and could simply be connections. Controller 530 and communication module 560 could be implemented, for example, in hardware, firmware, one or more components which execute software, or combinations thereof. Examples of components that could be used to implement the controller 530 and/or the communication module 560 include microprocessors, microcontrollers, ASICs, and FPGAs. As noted above for the transceiver 230 in FIG. 2, the exact form of the communication module 560 would depend on the type(s) of communications to be supported, but the communication module 560 would generally include some type of physical interface with one or more components to perform receive and transmit operations. The switches 570 and 580 could be solid state switches such as transistors, illustratively power MOSFETs, or other types of switches including switching devices with movable elements. Voltage sensor 510 and current sensor 520 could be implemented as a voltmeter and an ammeter as noted above, or voltage and/or current sensing could instead be integrated into controller 530.

Voltage sensor 510 monitors the output voltage of PID 500. Current sensor 520 monitors the output current of PID 500. When PID 500 is serially connected to a PV string, as in FIGS. 4A and 4B for example, the output current will be the PV string current. Diode 582 provides bypass diode functionality.

Controller 530 comprises communication module 560 for communication. Communication module 560 could be integrated into controller 530 as shown or provided as a separate component, and could support wired communications through Power Line Communications (PLC) for example, and/or support wireless communications, through ZIGBEE and/or Wi-Fi, for example. Communication module 560 could allow PID 500 to report its output voltage, output current, and/or output power to other components of a PV power system. For example, referring to FIGS. 4A and 4B, PIDs $405_1$, $405_2$ ... $405_{N-1}$, $405_N$ and $409_1$, $409_2$ ... $409_{M-1}$, $409_M$ could report their output voltages, output currents, and/or output powers to AFE 410.

The presence of an arc fault could be detected based on reported PID measurements. For example, PIDs $405_1$, $405_2$ ... $405_{N-1}$, $405_N$ in PV string 402 could report their current measurements to AFE 410. The presence of a parallel arc fault in string 402 could be detected by a current imbalance between PIDs $405_1$, $405_2$ ... $405_{N-1}$, $405_N$. If an arc fault were present, then the reported current of the PIDs supplying current to the arc fault could be greater than the reported current of PIDs not supplying current to the arc fault.

FIG. 5 is an example, and other PID designs are possible. For example, voltmeter functionality and ammeter functionality could be incorporated in controller 530 and the PID output current could be monitored by measuring a voltage using a sense resistor.

Figure 6:
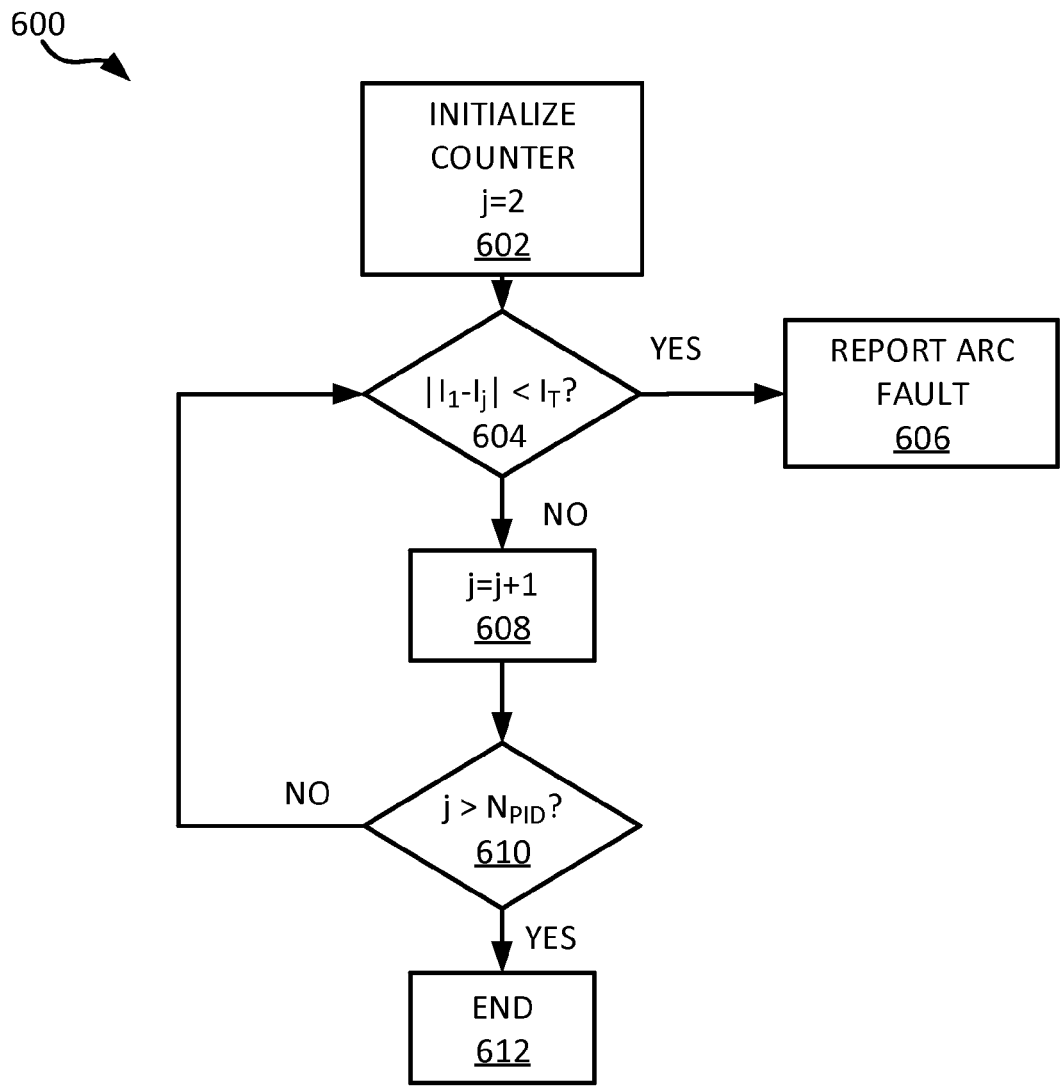
FIG. 6 is a flow diagram of another example arc fault detection method.

FIG. 6 is a flow diagram of an arc fault detection method, in this example a current imbalance arc fault detection method. In the example method 600, at 602 a PID counter is initialized to two. At 604 the output current of the first PID in the PV string $I_1$ is compared to the output current of the second PID in the string $I_2$. If the currents differ by an amount greater than an arc fault current threshold difference $I_T$ (YES at 604) then an arc fault is reported at 606. If the currents differ by less than the arc fault current threshold difference (NO at 604) then the PID counter is incremented at 608. The PID counter is evaluated at 610. If the PID count exceeds the number of PIDs in the string ($N_{PID}$), then the method ends at 612; otherwise the current of the next PID is evaluated at 604. The arc fault current threshold should be chosen to minimize false arc fault reporting and could account for current measurement and/or calibration errors between individual PIDs.

The presence of an arc fault could also or instead be detected based on reported PID output power measurements. Power could be measured and reported directly, or calculated by a PID or an AFE controller based on measured voltage and current, for example. An arc fault could be detected based on a power imbalance between the input power of an inverter and the total reported output power of all the PIDs connected to that inverter. For example, referring to FIGS. 4A and 4B, PIDs $405_1$, $405_2$ ... $405_{N-1}$, $405_N$ and $409_1$, $409_2$ ... $409_{M-1}$, $409_M$ could report their output power measurements to AFE 410, which could compare the total of reported power measurements to the input power of inverter 420. Inverter 420 could compute its input power from measurements of its input voltage and input current. If an arc fault were present, then the total reported PID power ($P_{PID}$) could be greater than the inverter input power $P_{INV}$. Power dissipated in the arc fault could appear in the PID output power measurements but would not appear in the inverter input power measurement. The presence of a parallel arc fault in a PV string 402, 406 could be detected by a power imbalance between the total PID power and the inverter input power.

Figures 7, 8:
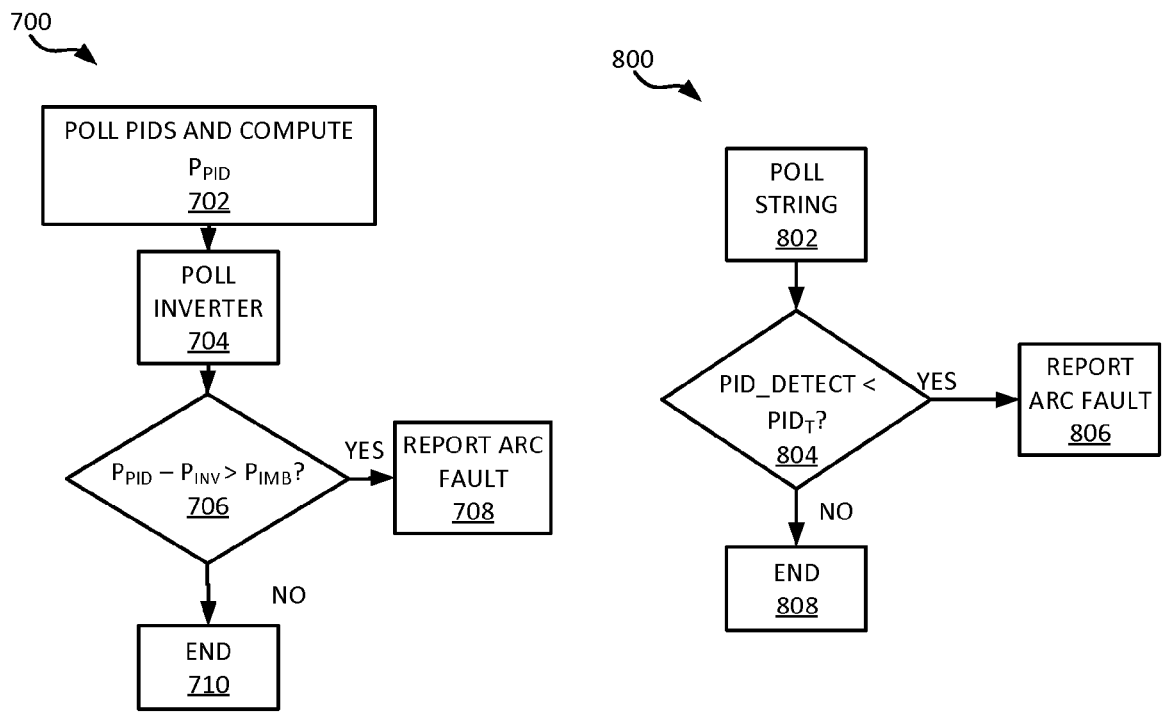
FIG. 7 is a flow diagram of a further example arc fault detection method.
FIG. 8 is a flow diagram of yet another example arc fault detection method.

FIG. 7 is a flow diagram of an example arc fault detection method 700, based on a PID power imbalance. At 702, the PIDs in a PV array are polled by an AFE to report their output power and the total PID power is calculated. At 704, the inverter is polled to report its input power. At 706, the difference between the total PID power ($P_{PID}$) and the inverter input power ($P_{INV}$) is compared to a power imbalance threshold ($P_{IMB}$). If the power difference is greater than the threshold (YES at 706) then an arc fault is reported at 708. If the power difference is less than the power imbalance threshold (NO at 706) then the method ends at 710. To minimize false arc fault detection, the power imbalance threshold should account for power measurement errors in the inverter and the PIDs as well as power losses in the PV power system wiring.

The process of reporting PID measurements such as output current or power to an AFE could take into account a timescale over which current or power might fluctuate due to changes in insolation, if there were a large number of PIDs and measurements were reported sequentially for example. In some situations the fluctuations could be accommodated by using large enough current and/or power threshold values to reduce false arc fault reports. In another embodiment, an AFE instead broadcasts a measurement command to components which report measurements, which could include the inverter and/or PIDs. The command signal would be received by the inverter and all PIDs at substantially the same time in most implementations, where physical separation between the AFE(s), inverter, and PIDs is not significant in terms of communication delay, and the measurements can be performed substantially simultaneously. The measurements could then be reported to the AFE sequentially or as demanded by the AFE. Any reporting delays between the first and last measurements would not affect the power or current imbalance calculation since the measurements would have been taken at substantially the same time. Another possible option would be to also or instead configure any measuring components at the PIDs and/or the inverter for a measurement and reporting schedule.

The presence of an arc fault could also or instead be detected based on an interruption in PID communications. For example, PIDs $405_1$, $405_2$ ... $405_{N-1}$, $405_N$ and $409_1$, $409_2$ ... $409_{M-1}$, $409_M$ in PV power system 400 could regularly report their output current or voltage measurements to AFE 410. AFE 410 could poll the PIDs for their output current or voltage measurements and/or for their presence. PIDs $405_1$, $405_2$ ... $405_{N-1}$, $405_N$ and $409_1$, $409_2$ ... $409_{M-1}$, $409_M$ could send periodic presence messages to AFE 410. The presence of an arc fault could be detected by a loss of PID communications. Arc faults are known to generate significant electrical noise and could interfere with PID communications, particularly if Power Line Communications were used.

FIG. 8 is a flow diagram of an example arc fault detection method 800, based on loss of PID communications. At 802, PIDs are polled by an AFE to report their presence. At 804, the number of PIDs which reported their presence (PID_Detect) is compared to a PID Detection threshold ($PID_T$). If the number of detected PIDs is less than the PID detection threshold (YES at 804) then an arc is reported at 806. If the number of detected PIDs exceeds the detection threshold the method ends at 808. The PID detection threshold should be chosen to reduce false arc fault detection and could account for unrelated communication failure such as from a failed PID. In one embodiment the PID detection threshold is the number of panels in the string less the minimum number of PV panels that could sustain an arc. For example, if there are N PV panels in a string, the maximum PV panel voltage is $V_{MAX}$ and the minimum voltage to sustain an arc fault is $V_{ARC}$ volts, then the PID detection threshold $PID_T$ could be set to a value of $$N-\text{INT}(V_{ARC}/V_{MAX}+1)$$

where the function INT returns the rounded down integer value of its argument.

Although FIG. 8 shows the example method 800 ending at 808, the method could be repeated periodically. For example, in another embodiment, the decrease in the number of reported PIDs in a string to below the PID detection threshold must occur substantially simultaneously, during a single PID polling operation for an arc fault to be declared.

It could be beneficial to avoid false detection of an arc fault since some safety codes require shut down and/or disconnect of a PV power system from an electrical grid and a manual inspection before the PV power system can be restarted. It could therefore be beneficial to combine different arc fault detection methods to avoid false positives. Thus, the example arc fault detection methods disclosed herein are not necessarily mutually exclusive, and multiple arc fault detection methods could be used in any AFE. For example, for arc fault detection methods that involve reporting of measurements from PIDs, an interruption in communications could be detected as a failure of any one or more PID(s) to provide measurements, and the interruption could also be used in detecting an arc fault.

Arc Fault Extinguishing

Once an arc fault is detected, it could be reported as described herein. In some embodiments, arc faults are extinguished before serious damage can occur. Any of the example arc fault detection methods disclosed herein could be supplemented with additional operations to extinguish a detected arc fault. Arc fault extinguishing could instead be implemented separately, such that a device that performs arc fault detection need not necessarily itself also handle arc fault extinguishing, and vice versa.

Referring to FIG. 1A, a series arc fault such as fault 130 in PV string 102 could be extinguished by open circuiting or rendering high impedance the combined PV panel output at terminal pair 150, 152. This could be accomplished by AFE 110 becoming open circuit or high impedance at its input. Referring to FIG. 2, in normal non-fault power producing operation, switch 212 is normally closed and shunt switch 214 is normally open. AFE 200 could therefore open circuit its input by opening series switch 212 while keeping parallel or shunt switch 214 open. With switches 212 and 214 open or high impedance a series arc fault current could not flow or could at least be sufficiently reduced so that the arc fault is extinguished.

A parallel arc, such as arc faults 132, 134, 136 and 138 in FIG. 1A would not necessarily be extinguished by rendering the combined PV panel output at terminal pair 150, 152 open circuit and could continue to burn since the arc fault current does not pass through that terminal pair. A parallel arc fault could however, be extinguished by the combined PV panel output becoming shunted or low impedance.

An arc fault requires a voltage to sustain itself. The shunting of the combined PV panel output at terminal pair 150, 152 could reduce the arc fault voltage to below the level required to sustain the arc fault, due to the presence of PV panel bypass diodes. The minimum arc fault sustaining voltage in a PV power system could be around 30 V.

Referring to FIG. 1A, a parallel arc fault such as fault 136 in PV string 106 could be extinguished by shunting, or otherwise rendering low impedance, the combined PV panel output at terminal pair 150, 152. This could be accomplished by AFE 110 becoming shunted or low impedance at its input. For example, referring to FIG. 2, AFE 200 could shunt and render low impedance its input by closing switch 214. The shunting of the combined PV panel output results in the series connection of bypass diodes $109_1, 109_2, \ldots 109_{M-2}$ being coupled across, or placed in parallel with, arc fault 136. In this situation bypass diodes $109_1, 109_2 \ldots 109_{M-2}$ will be forward biased by the arc fault voltage and will begin to conduct. The arc fault voltage of arc fault 136 will be limited to the sum of the forward bias drops across bypass diodes $109_1, 109_2 \ldots 109_{M-2}$. For example, a typical diode forward bias drop is 0.7 V and therefore if N=10 then arc fault voltage would be limited to 7.0 V, which is insufficient to sustain an arc fault.

It could be preferable for switch 212 to be open when switch 214 was closed. An inverter could have significant input capacitance (hundreds of uFs) which is charged to the PV string voltage during normal operation. Closing switch 214 with switch 212 closed would shunt the charged inverter input capacitance and could stress switches 212 and 214.

Shunting the combined PV panel output at terminals 150, 152 could also extinguish a parallel arc in a PV power system equipped with PIDs if the PIDs incorporated bypass diode functionality. For example, referring to FIG. 4B, parallel fault 436 in PV power system 400 could be extinguished by shunting the input of AFE 410. The PIDs could be equipped with dedicated bypass diodes such as bypass diode 582 (FIG. 5). Alternately, if switch 580 in FIG. 5 were a MOSFET switch it could have an intrinsic body diode which could provide bypass functionality.

The shunting and/or open circuiting of the combined PV panel output of a PV power system to extinguish an arc fault as described herein could be performed by an inverter, in which case an AFE might only detect the arc fault and the inverter would perform the actual extinguishing. For example, an inverter could disconnect its input or render it high impedance under control of an AFE to perform the same series arc fault extinguishing function as the AFE open circuiting operation described herein. An inverter could also incorporate a shunt switch across its input terminals under control of an AFE to perform the same parallel arc fault extinguishing function as the AFE shunting operation described herein.

A parallel arc fault within a PV string, between segments of PV string conductors that are not normally directly connected together, could be extinguished by shunting or rendering low impedance a PV string output. This could be implemented in a PV power system as shown in FIG. 1B, for example, where each PV string 102, 106 has its own AFE 160, 162.

Arc fault extinguishing operations could be performed in a sequence to ensure both series and parallel arc faults are extinguished.

The extinguishing of both series and parallel arc faults could be ensured by first shunting the combined PV panel output and then, if the arc fault still persists, open circuiting the combined PV panel output, or by first open circuiting the combined PV panel output and then, if the arc fault still persists, shunting the combined PV panel output.

The table below describes the dependence of the state of the combined PV panel output and the viability of series and parallel arcs based on the state of shunt and series switches, such as for example, switches 214 and 212, respectively, of AFE 200 in FIG. 2.

| Shunt Switch | Series Switch | AFE input | Series Arc | Parallel Arc |
|---|---|---|---|---|
| Open | Closed | Normal inverter load | Possible | Possible |
| Open | Open | Open Circuit | Extinguished | Possible |
| Closed | Open | Shunted | Possible | Extinguished |
| Closed | Closed | Shunted | Possible | Extinguished |

Figure 9:
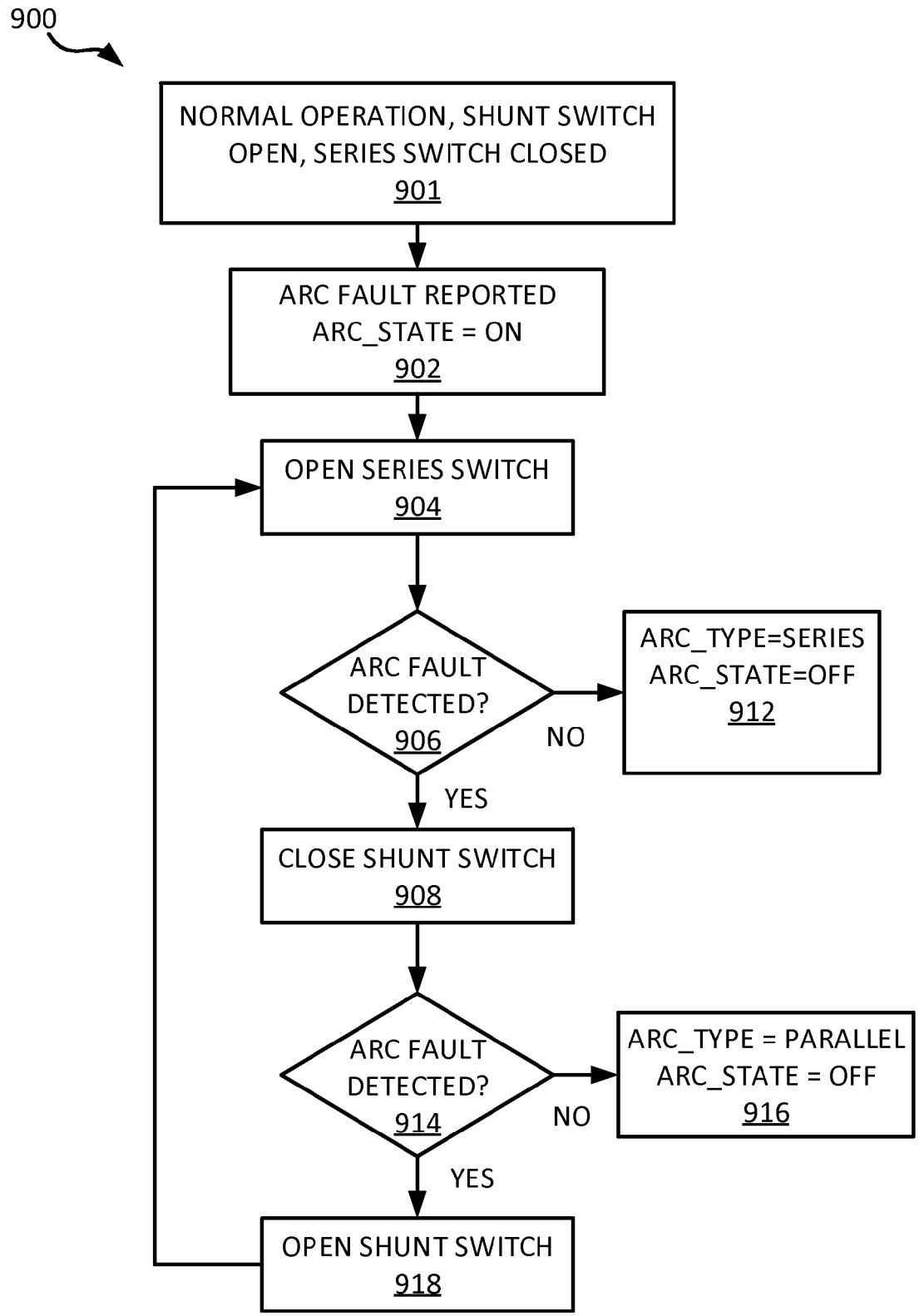
FIG. 9 is a flow diagram of an example arc fault extinguishing method.

FIG. 9 is a flow diagram of an example arc fault extinguishing method 900. At 901, the PV power system is in normal non-fault operation and producing power with a shunt switch, such as for example switch 214 of AFE 200 (FIG. 2), open and a series switch, such as for example switch 212 of AFE 200, closed. At 902, an arc fault is reported and an arc state is set to ON. At 904, the series switch is opened. At 906, a check for the presence of the arc fault is performed. Although not explicitly shown in FIG. 9, the check at 906 could be made after a time delay to provide time for a series arc fault to extinguish. If the arc fault is no longer present (NO at 904), then the arc fault is reported to be a series arc and the state of the arc fault is set to OFF at 912. Alternately the determination at 906 could involve a series of repeated measurements over a time interval.

If the arc fault is still present (YES at 904) then the shunt switch is closed and the series switch remains open at 908. At 914, a check for the presence of the arc fault is performed. As noted above for the check at 906, there could be a time delay before the determination is made at 914 to provide time for the arc fault to extinguish. Alternately the determination at 914 could involve a series of repeated measurements over a time interval. If the arc fault is no longer present (NO at 914), then the arc fault is reported to be a parallel arc fault and the state of the arc fault is set to OFF at 916. If the arc fault is still present (YES at 914), then the shunt switch is reopened at 918. The previously open series switch is reaffirmed as open at 904 and the cycle repeats until the arc fault is determined as no longer present at one of 906 or 914. In one embodiment, the wait time between opening the series switch at 904 and determination of an arc fault at 906 and the wait time between closing shunt switch 908 and determination of an arc fault at 914 are both increased from one cycle to the next to a maximum value. In another embodiment the time intervals for the determination of an arc fault at 906 and 914 are both increased to a maximum value.

Figure 10:
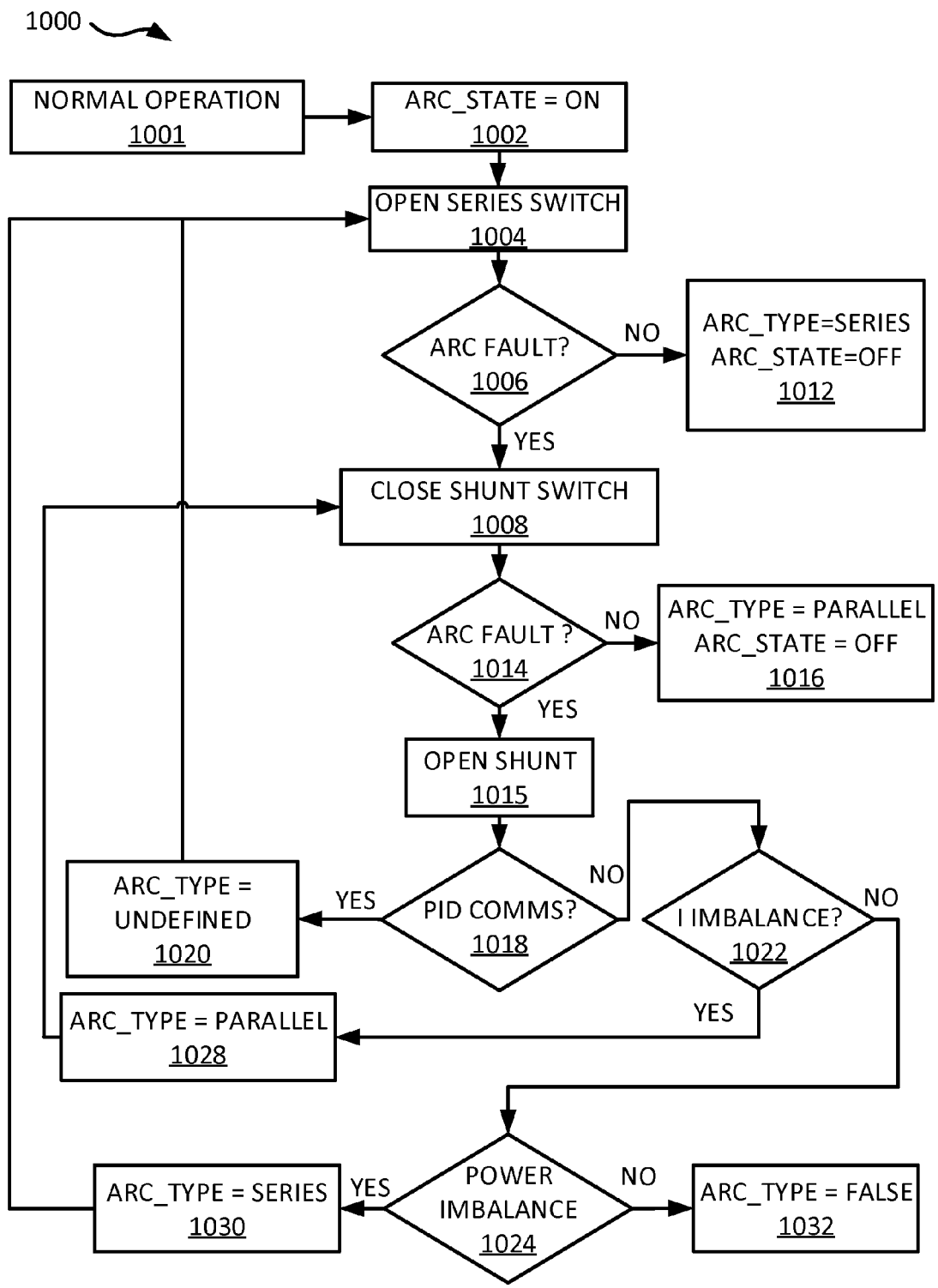
FIG. 10 is a flow diagram of another example arc fault extinguishing method.

FIG. 10 is a flow diagram of another example arc fault extinguishing method 1000. At 1001, the PV power system is in normal non-fault operation and producing power with a shunt switch, such as for example switch 214 of AFE 200 (FIG. 2), open and a series switch, such as for example switch 212 of AFE 200, closed. At 1002, an arc fault is reported and an arc state is set to ON. At 1004, the series switch is opened. At 1006, possibly after a time delay, a check for the presence of the arc fault is performed. If the arc fault is no longer present (NO at 1006), then the arc fault is reported to be a series arc and the state of the arc fault is set to OFF at 1012.

If the arc fault is still present (YES at 1006) then the shunt switch is closed at 1008. At 1014, possibly after a time delay, a check for the presence of the arc fault is performed. If the arc fault is no longer present (NO at 1014), then the arc fault is reported to be a parallel arc fault and the state of the arc fault is set to OFF at 1016. If the arc fault is still present (YES at 1014), then the shunt switch is opened at 1015.

An arc fault detection method using PID communications is performed at 1018. For example, the arc fault detection at 1018 could use the example method 800 of FIG. 8. If the PID communication arc fault detection at 1018 reports an arc fault (YES at 1018), then the arc type is reported as undefined at 1020, and the series switch is opened at 1004, and the cycle repeats. If no arc fault is detected based on PID communications (NO at 1018), then a current imbalance arc fault detection method is performed at 1022, which could involve the example method 600 in FIG. 6 in an embodiment. If the current imbalance detection method reports an arc fault (YES at 1022), then the arc type is reported as parallel at 1028, the shunt switch is closed at 1008, and the cycle repeats. If no arc fault is detected based on current imbalance (NO at 122), then a power imbalance arc fault detection method is performed at 1024. If the power imbalance detection method detects an arc fault (YES at 1024), then the arc type is reported as series at 1030, the series switch is opened at 1004, and the cycle repeats. If no arc fault is detected (NO at 1024), then the arc type is reported as false at 1032. In one embodiment, the PV power system returns to normal operation after the arc is declared as false.

The example method 1000 illustrates how multiple arc fault detection methods could be combined with arc fault detection. Arc fault extinguishing and detection could be implemented separately or used together in other combinations.

Overview

Figure 11:
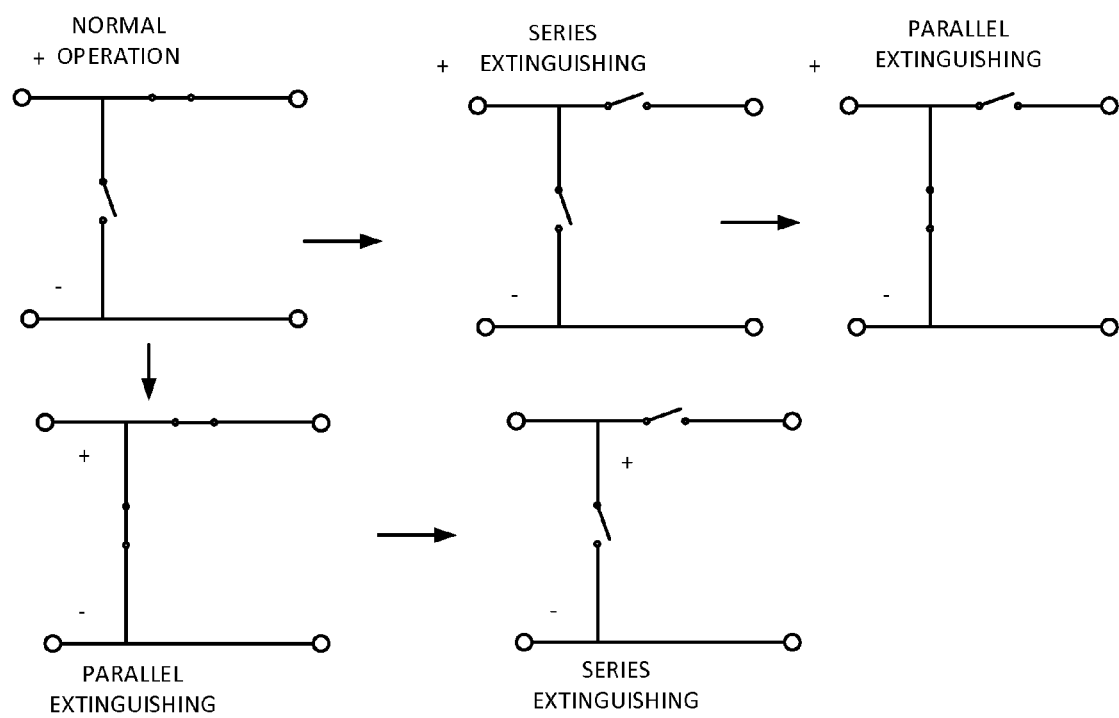
FIG. 11 includes schematic diagrams illustrating example switch control sequences.

Various embodiments are described above, with reference to FIGS. 1 to 10. According to the present disclosure, any of several techniques could be used to detect arc faults, and several switching sequences could be used to extinguish such arcs. During normal operation, a shunt switch such as switch 214 in FIG. 2 is open, and a series switch such as switch 212 in FIG. 2 is closed. The position of either switch could be changed on detection of an arc fault. This is shown in FIG. 11, which includes schematic diagrams illustrating example switch control sequences. Although the upper switch sequence in FIG. 11, to first open the series switch to extinguish a series arc fault and then close the shunt switch to extinguish a parallel arc fault might be preferred, it is also possible to first close the shunt switch to extinguish a parallel arc fault and then open both switches to extinguish a series arc fault.

More generally, according to an embodiment, an arc fault extinguisher includes a first switch such as 212 in FIG. 2 for connection in a first circuit path between a PV panel string and an inverter in a power system, a second switch such as 214 in FIG. 2 for connection in a second circuit path across an output of the PV panel string, and a controller such as 220 in FIG. 2, coupled to the first switch and the second switch. The controller is configured to control the first switch to be closed and the second switch to be open during non-fault operation of the power system, as shown in the "NORMAL OPERATION" switch diagram in FIG. 11. The controller is also configured to control the first switch to open on detection of an arc fault in the power system, and to control the second switch to close on detection of an arc fault in the power system.

The controller could be configured to control the first switch to open on detection of an arc fault in the power system and to close the second switch while the first switch is open on detection of an arc fault in the power system, as shown in the upper switch sequence in FIG. 11.

The controller could be configured to instead control the second switch to close on detection of an arc fault in the power system and to open the first and second switches on detection of a continued arc fault in the power system, as shown in the lower switch sequence in FIG. 11.

The controller could be configured to detect arc faults by frequency analysis, which could involve obtaining measurement samples of current or power flow in the PV panel string, computing frequency components of the measurement samples in a frequency spectrum, and detecting an arc fault in the power system where at least a predetermined number of the frequency components, including any of the frequency components in the frequency spectrum, exceed a threshold amplitude. This is also referenced herein as a probabilistic "binning" approach, and an example is shown in FIG. 3. Although FIG. 3 is a flow chart of an example method, method embodiments as shown in FIG. 3, as shown in other drawings, and/or as otherwise disclosed herein, are subject to apparatus implementation, using a controller or other component. A controller could be configured to perform operations in any of various ways, such as through execution of software for example.

As noted herein, multiple arc fault detection techniques could be used. For example, the controller could be configured to detect arc faults by a combination of frequency analysis and measurements at PV panels in the PV panel string.

For arc fault detection based on measurements at more than one PV panel in the PV panel string, the controller could be configured to detect arc faults on determining that a current or power imbalance based on measurements of current or power flow at each of multiple PV panels in the PV panel string exceeds a threshold.

As shown in FIG. 2, an arc fault extinguisher could also include a transceiver 230, coupled to the controller, to enable communications between the controller and PV panels in the PV panel string. The controller could then be configured to detect arc faults based on interruption in communications with a subset of the PV panels. Communications with the PV panels could be through interface devices such as PIDs as shown in FIGS. 4A and 4B. In embodiments where the controller is configured to poll interface devices at the PV panels to report their presence as in FIG. 8, for example, the controller could be configured to detect arc faults based on interruption in communications occurring within a predetermined time period. The time period could correspond to the time for a single polling period in which each interface device is polled. The time period could instead correspond to the time for an arc fault to completely develop.

The example methods 900 and 1000 in FIGS. 9 and 10 both involve controlling first and second switches, such as the switch 212 in FIG. 2, in a first circuit path between a PV panel string and an inverter in a power system, and the switch 214 in FIG. 2, in a second circuit path between output terminals of the PV panel string. During normal non-fault operation of the power system as shown at 901 and 1001 in FIGS. 9 and 10, the first (series) switch is controlled to be closed and the second (shunt) switch is controlled to be open. At 904, 1004, the first (series) switch is controlled to open on detection of an arc fault in the power system, and the second (shunt) switch is controlled to close at 908, 1008 on detection of an arc fault in the power system.

In both of the example methods, the first (series) switch is controlled to open at 904, 1004 on detection of an arc fault in the power system, and the second (shunt) switch is controlled to close at 908, 1008 while the first (series) switch is open on detection of an arc fault in the power system. FIG. 10 also shows operations of controlling the second (shunt) switch to open at 1015 on detection of a continued arc fault in the power system at 1014 after the second (shunt) switch is closed. It is possible to either open the series switch first or close the shunt switch first on detection of an arc fault.

The other of the series switch and the shunt switch could subsequently be opened if an arc fault continues after the first control operation to change switch state is executed. These options are shown in the upper and lower switch sequences in FIG. 11, and thus the first (series) switch could be controlled to open on detection of a continued arc fault in the power system after the second (shunt) switch is closed. Although this is perhaps best shown in the switch sequences in FIG. 11, tracing through the example method 1000 in FIG. 10 at 1008 through 1014, 1015, and any one of 1018, 1022, 1024 back to 1004 also illustrates control of the first (series) switch to open on detection of a continued arc fault after the second (shunt) switch is closed.

Another method involves obtaining measurement samples of current or power flow in a power system which includes PV panels and computing frequency components of the measurement samples in a frequency spectrum. These operations are shown by way of example in FIG. 3 at 302, 304. A method could also involve detecting an arc fault in the power system where at least a predetermined number of the frequency components, including any of the frequency components in the frequency spectrum, exceed a threshold amplitude. A count of frequency components exceeding a threshold amplitude $A_T$ is maintained at 310 in FIG. 3 using the variable ARC_COUNT, and arc fault detection is shown at 316.

The current or power samples could be obtained by measuring the current or power flow in the power system. Current or power flow measurements need not be made by the same physical component or at the same location as the arc fault detection. For example, with reference to FIG. 4A, the actual measurements could be made at each PV panel 404, 408, and the AFE 410 could then "obtain" those measurements through communications with the PIDs 405, 409 at each PV panel. In the case of power-based arc fault detection, power could be measured directly or calculated, at the PV panels 404, 408 by the PIDs 405, 409 or at the AFE 410, based on measured PV panel current and voltage. In a multi-string power system, measurement samples of current or power flow in each of the multiple strings of PV panels could be obtained.

Arc fault detection based on current or power imbalance is also possible. For example, a method could involve obtaining measurements of current or power flow at each of multiple PV panels connected together in one or more respective circuit paths in a power system. FIGS. 4A and 4B show multi-string embodiments, but there need not be multiple strings in every power system. A determination is made as to whether a current or power imbalance based on the measurements exceeds a threshold, and an arc fault is detected in the power system where it is determined that the current or power imbalance exceeds the threshold.

The determining could involve determining whether a difference in the measurements of the current at different ones of the PV panels in each circuit path exceeds the threshold. Such a method is shown by way of example in FIG. 6. Measurements of PV panel currents are obtained, and a threshold determination is made at 604. An arc fault is detected, and also reported at 606 in the example method 600, where it is determined at 604 that the current imbalance exceeds the threshold.

For power imbalance-based arc fault detection, PV panel power measurements are obtained, such as at 702 in FIG. 7. A measurement of total output power from the PV panels is also obtained, and this is shown by way of example in FIG. 7 at 704, by polling a central inverter such as the inverter 120, 420 in FIGS. 1A, 1B, 4A, 4B. The threshold determination could then involve determining whether an amount, by which a total of the measurements of power flow at each of the PV panels exceeds the measurement of total output power, exceeds the threshold. A total of the measurements of power flow at each of the PV panels is computed at 702 in FIG. 7, for example, and this type of threshold determination is also illustrated in FIG. 7 at 706.

In a method that involves obtaining measurements by receiving such measurements from the PV panels through communications with the PV panels, an arc fault could be detected based on interruption of communications with the PV panels.

Such communications-based arc fault detection could also be implemented separately, by monitoring communications with PV panels in a power system, and detecting an arc fault in the power system based on an interruption in communications with any of a predetermined number of the PV panels. Such a method is shown in FIG. 8. The monitoring in the example method 800 involves a polling operation at 802 and the determination at 804. Polling operations at 802 could be performed, to poll interface devices such as the PIDs 405, 409 in FIGS. 4A, 4B at the PV panels 404, 408 in each polling operation to report their presence. Arc fault detection could then involve detecting an arc fault based on interruption in communications with any of a predetermined number of the PV panels in a single polling operation. Different numbers of PIDs could report their presence in different polling operations, for example, but an arc fault might not be detected unless fewer than a predetermined number of the PIDs report their presence in any single polling operation cycle.

CONCLUSION

What has been described is merely illustrative of the application of principles of embodiments of the present disclosure. Other arrangements and methods can be implemented by those skilled in the art.

For example, any divisions of function in the drawings are not intended to be limiting or exhaustive. Other embodiments could include additional, fewer, and/or different components than shown. Similarly, other method embodiments could include additional, fewer, and/or different operations performed in an order similar to or different from the orders shown in the drawings and described above. In addition, although several example methods are shown in the drawings as ending after certain operations are performed, the methods could be repeated multiple times during operation of a PV power system, to provide for ongoing arc fault monitoring, for instance.

Various thresholds are described herein. A threshold condition of a monitored quantity being equal to a threshold could be treated in the same way as the monitored quantity being less than the threshold or in the same way as the monitored quantity being greater than the threshold. Thus, any threshold decision could be "less than or equal to" or "greater than or equal to" and need not necessarily be "less than" or "greater than".

Also, although described primarily in the context of methods and systems, other implementations are also contemplated, as instructions stored on a non-transitory computer-readable medium, for example.

The invention claimed is:

1. A method comprising:
obtaining measurement samples of current or power flow at a location in a power system, said power system comprising a plurality of PhotoVoltaic (PV) panels;
computing, from said measurement samples, frequency components of said current or power flow in a frequency spectrum;
detecting an arc fault in said power system only when at least a predetermined number of said frequency components, including any of said frequency components in said frequency spectrum, exceed a common threshold amplitude.

2. The method of claim 1, said obtaining comprising measuring said current or power flow in said power system.

3. The method of claim 1, said obtaining comprising obtaining measurement samples of current or power flow in each of a plurality of strings of PV panels in said power system.

4. The method of claim 1, wherein the detecting comprises:
incrementing a count for any of said frequency components that exceed the common threshold amplitude;
determining whether the count is at least the predetermined number;
detecting an arc fault where the count is at least the predetermined number.

5. The method of claim 1, wherein the predetermined number is greater than 1 and less than a total number of said frequency components.

6. A method comprising:
obtaining measurements of power flow at each of a plurality of PhotoVoltaic (PV) panels connected together in one or more respective circuit paths in a power system;
determining whether a power imbalance based on said measurements exceeds a threshold;
detecting an arc fault in said power system where it is determined that said power imbalance exceeds said threshold;
obtaining measurements of current at each of the plurality of PV panels;
determining whether a difference in said measurements of said current at different ones of said PV panels in each said circuit path exceeds a threshold for current;
detecting an arc fault in said power system where it is determined that said difference in said measurements of said current exceeds said threshold for current.

7. The method of claim 6, further comprising:
obtaining a measurement of total output power from said plurality of PV panels,
said determining whether a power imbalance based on said measurements exceeds a threshold comprising determining whether an amount, by which a total of said measurements of power flow at each of said plurality of PV panels exceeds said measurement of total output power, exceeds said threshold.

* * * * *